United States Patent [19]

Satou et al.

[11] 4,209,713
[45] Jun. 24, 1980

[54] SEMICONDUCTOR INTEGRATED CIRCUIT DEVICE IN WHICH DIFFICULTIES CAUSED BY PARASITIC TRANSISTORS ARE ELIMINATED

[75] Inventors: Kazuo Satou, Yokohama; Mitsuhiko Ueno, Fujisawa; Yasoji Suzuki, Ayase, all of Japan

[73] Assignee: Tokyo Shibaura Electric Company, Limited, Kawasaki, Japan

[21] Appl. No.: 911,164

[22] Filed: May 31, 1978

Related U.S. Application Data

[63] Continuation of Ser. No. 705,960, Jul. 16, 1976, abandoned.

[30] Foreign Application Priority Data

Jul. 18, 1975 [JP] Japan ............................. 50-87917
Jan. 8, 1976 [JP] Japan ............................. 51-1132

[51] Int. Cl.$^2$ ................. H03K 17/16; H03K 17/72; H03K 19/40; H01L 27/02
[52] U.S. Cl. ............................. 307/200 B; 307/205; 307/213; 307/251; 307/304; 357/42
[58] Field of Search ................ 307/200 B, 213, 214, 307/251, 304, 205; 330/207 P; 357/42

[56] References Cited

U.S. PATENT DOCUMENTS

| | | | |
|---|---|---|---|
| 3,601,625 | 8/1971 | Redwine et al. | 307/304 X |
| 3,712,995 | 1/1973 | Steudel | 307/304 |
| 3,862,441 | 1/1975 | Nabetani et al. | 307/304 X |
| 3,934,159 | 1/1976 | Nomiya et al. | 307/304 |
| 3,955,210 | 5/1976 | Bhatia et al. | 357/42 |
| 3,956,880 | 5/1976 | O'Connor | 307/221 C X |
| 4,015,147 | 3/1977 | Davidson et al. | 357/42 X |

FOREIGN PATENT DOCUMENTS

2417054 10/1975 Fed. Rep. of Germany ........... 307/304

OTHER PUBLICATIONS

Dennehy et al., "Non-Latching Integrated Circuits", RCA Tech. Notes, TN. No. 876, 2/12/71, 4 pgs.

Primary Examiner—Larry N. Anagnos
Attorney, Agent, or Firm—Oblon, Fisher, Spivak, McClelland & Maier

[57] ABSTRACT

A semiconductor integrated circuit device comprising a CMOS circuit in which parasitic transistors form a parasitic thyristor circuit. In this device, noise absorption resistances are provided at the noise inputs to absorb noise which otherwise might become trigger pulses for the thyristors.

4 Claims, 9 Drawing Figures

SEMICONDUCTOR INTEGRATED CIRCUIT DEVICE IN WHICH DIFFICULTIES CAUSED BY PARASITIC TRANSISTORS ARE ELIMINATED

This is a continuation of application Ser. No. 705,960, filed July 16, 1976, now abandoned.

BACKGROUND OF THE INVENTION

1. Field of the Invention:

This invention relates to semiconductor integrated circuit devices and in particular to Complementary Metal Oxide Semiconductor field effect transistors (hereinafter referred to by the abbreviation CMOS) in which difficulties caused by parasitic bipolar transistors are eliminated.

2. Description of the Prior Art:

Various CMOS circuits have been known in the past, and a typical example of these is a CMOS inverter circuit. This inverter circuit is made up of a P channel type MOS transistor $Q_1$ and an N channel type MOS transistor $Q_2$; the source electrode of the transistor $Q_1$ is connected to a positive power source $V_{DD}$; the drain electrode of the transistor $Q_1$ and the drain electrode of the transistor $Q_2$ are connected together and both are connected to an output terminal OUT, and the source electrode of the transistor $Q_2$ is connected to a negative power source $V_{SS}$. Also, the gate electrodes of the transistors $Q_1$ and $Q_2$ are both connected to an input terminal IN to make up an inverter.

In a CMOS circuit constructed in this manner, the threshold direct voltages $V_{th}$ of the N and P channel MOS transistors have opposite polarities, and therefore their actions on input voltages are entirely opposite to one another, and the operating power is extremely small. For example, if the power source $V_{DD}$ is made +5 V and the power souce $V_{SS}$ is made earth (GND), and if +5 V is supplied to the input IN, the transistor $Q_2$ conducts and the transistor $Q_1$ does not conduct, and no direct current at all flows between the power sources $V_{DD}$ and $V_{SS}$. Conversely, if zero V is supplied to the input IN, the transistor $Q_2$ becomes non-conductive and the transistor $Q_1$ becomes conductive, and once again direct current does not flow between the power sources $V_{DD}$ and $V_{SS}$. Therefore, in the CMOS circuit there is generally practically no operating power consumption; in the input information pulse transition time region, the transistors $Q_1$ and $Q_2$ both conduct, and all that happens is that an instantaneous transition current flows along with leakage current occurring at the PN junctions, and the current due to the charge and discharge of the load capacity at the output. Accordingly, in general the power of CMOS circuits can be said to be extremely small.

But in CMOS circuit systems of this kind, when noise in the form of an impulse is applied to the output or to the input, a large direct current (several dozen mA to several hundred mA) flows between the power sources $V_{DD}$ and $V_{SS}$, and even when this noise is stopped, a phenomenon occurs whereby the large current continues to be maintained steadily. This phenomenon (hereinafter referred to as "Latch-up") magnifies the power consumption, and leads to a CMOS circuit of low reliability. The polarity of this impulse can be positive or negative; in order to eliminate this phenomenon it is necessary to reduce the power souce $V_{DD}$ below a certain voltage, or to cut off the power sources of the circuit system.

SUMMARY OF THE INVENTION

Accordingly, one object of this invention is to provide a novel semiconductor CMOS integrated circuit device in which difficulties caused by parasitic bipolar transistors are eliminated.

Another object of this invention is to provide a CMOS integrated circuit device in which an accidental large direct current does not flow between power sources.

Yet another object of this invention is to provide a CMOS integrated circuit device of high reliability.

A further object of this invention is to provide a CMOS integrated circuit whose power consumption is reduced and whose characteristics are improved.

The objects of the present invention are achieved by a semiconductor integrated circuit device comprising a CMOS circuit whose structure is characterized by the formation therein of parasitic thyristors, and noise absorption means connected to the CMOS circuit for absorbing impulse noise that otherwise could become trigger pulses for the thyristors.

BRIEF DESCRIPTION OF THE DRAWINGS

A more complete appreciation of the invention and many of the attendant advantages thereof will be readily appreciated as the same becomes better understood by reference to the following detailed description when considered in connection with the accompanying drawings, wherein.

DETAILED DESCRIPTION OF THE PREFERRED EMBODIMENTS

Figure 1:
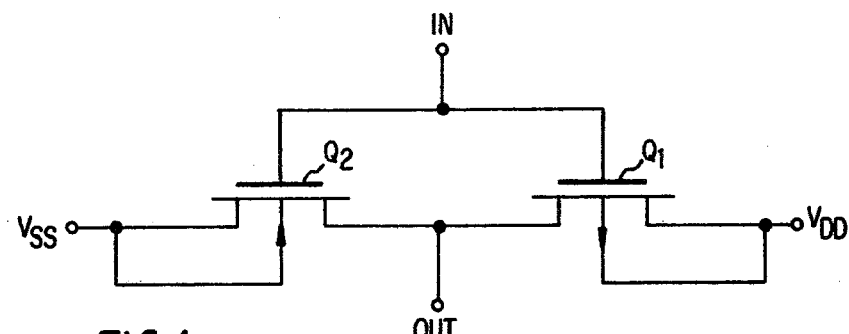
FIG. 1 is a circuit diagram of a CMOS inverter.
Figure 2:
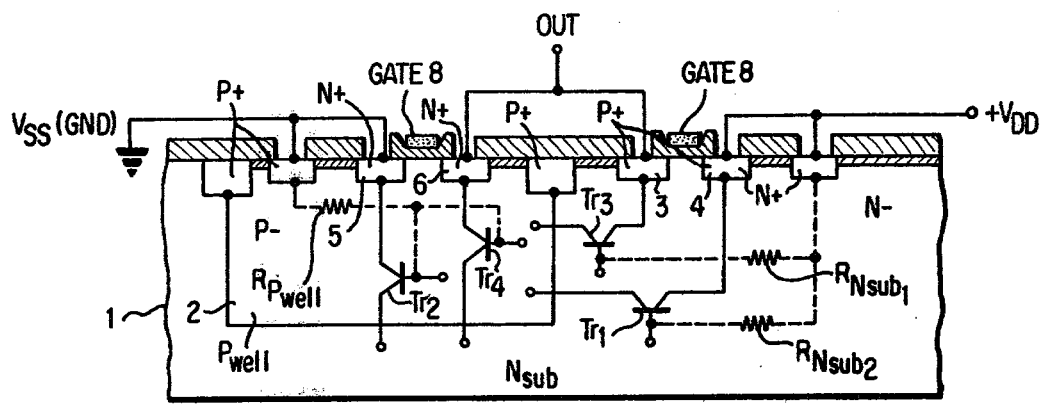
FIG. 2 shows a sectional structural diagram of a CMOS inverter and parasitic bipolar transistors.

Referring to FIG. 1, there is shown a CMOS inverter circuit, and FIG. 2 shows a sectional drawing of this circuit completed to make up a semiconductor wafer as an example. In this example, what is known as a P-well layer 2 having a P type impurity in a concentration of about $2 \times 10^{16}$ atoms/cm$^3$ is formed in an N type base plate 1 having a concentration of about $1 \times 10^{15}$ atoms/cm$^3$, and in the N type base plate outside this layer 2, P type regions 3 and 4, which becomes P channel MOS transistors, are formed by diffusion so that their concentration is for instance about $10^{19}$ atoms/cm$^3$. On the other hand, inside the P-well layer 2, also, a P type region is formed which becomes an N channel MOS transistor stopper, and also in the P-well layer N type regions 5 and 6 which become N channel MOS transistors are formed by diffusion of about $10^{20}$ atoms/cm$^3$ of an N type impurity. After this, a silicon oxide film about 1500 Å thick is provided in the places which become the gates 7 and 8 of the MOS transistors, the necessary parts are apertured and the circuit is wired with a conductor such as Al, and a CMOS semiconductor element is thus obtained.

Figure 3:
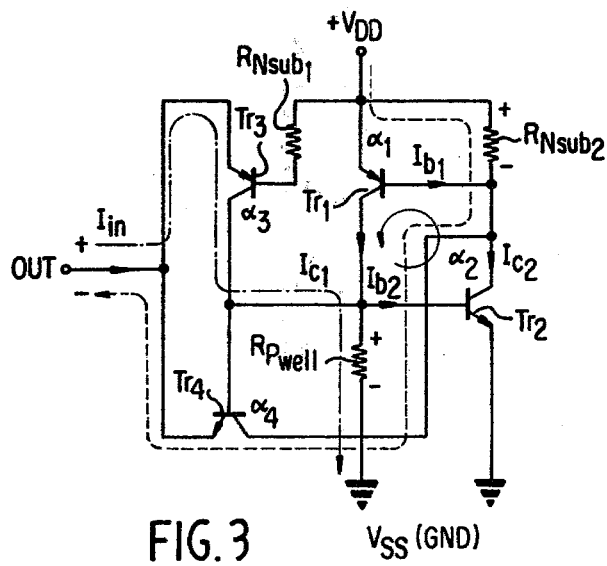
FIG. 3 shows an equivalent circuit diagram of the parasitic thyristor shown in FIG. 2.

This invention has been perfected on the basis of the fact that it has been discovered that the thyristor circuits shown in FIG. 3 are formed in a CMOS structure.

FIG. 2 shows the manner in which the aforesaid thyristor circuits are formed in the CMOS inverter circuit of FIG. 1; FIG. 3 is a diagram showing the equivalent circuit of FIG. 2 consisting of a plurality of parasitic bipolar transistors. As soon as the thyristor action occurs, the power is often magnified and this causes thermal breakdown.

The above-mentioned thyristor circuits will now be described with reference to FIG. 3; in the P-well region 2 formed in the N type semiconductor substrate 1, parasitic bipolar transistors $Tr_2$ and $Tr_4$ are formed along the direction of the thickness of the substrate 1, and in the substrate 1 outside the P-well region parasitic transistors $Tr_1$ and $Tr_3$ are formed in a direction at right angles to the direction of this thickness; also, resistances $R_{Pwell}$, $R_{Nsub1}$ and $R_{Nsub2}$ are formed which are present in the P-well region 2 and the substrate 1. Now, as shown by the chain-dotted line arrow in FIG. 3, when positive impulse noise is applied to the output OUT, a current $\alpha_3 \times I_{in}$ flows, bypassing the $R_{Pwell}$ region, and when the voltage drop of this has become $V_{BE2}$, a current flows in the base of the transistor $Tr_2$.

$$I_{b2} \delta \alpha_3 I_{in} \ (R_{Pwell} >> r_{be2}) \tag{1}$$

$$I_{c2} = \beta_2 I_2 = \beta_2 \alpha_3 I_{in} \tag{2}$$

Here, $I_{b2}$ and $I_{c2}$ are the base and collector currents of the transistor $Tr_2$, $\alpha_1$, $\alpha_2$, $\alpha_3$ and $\alpha_4$ are the common base current gain of the transistors $Tr_1$, $Tr_2$, $Tr_3$ and $Tr_4$, $\beta_1 = \alpha_1/1 - \alpha_1$, $\beta_2 = \alpha_2/1 - \alpha_2$ are the common emitter current gain and $I_{in}$ is the impulse noise.

Similarly, when $I_{c2}$ has become the drive current and the voltage drop across $R_{Nsub2}$ has become $V_{Be1}$, the base current of the transistor $Tr_1$ flows and this goes into the conductive state.

$$I_{b1} = I_{c2} \ (R_{Nsub} \gtrsim r_{be1}) \tag{3}$$

$$I_{c1} = \beta_1 I_{b1} = \beta_1 \beta_2 \alpha_3 I_{in} \tag{4}$$

Even if the application of further noise from outside is stopped, the current between the power source $V_{DD}$ and GND, that is to say between $Tr_1$ and $Tr_2$, will be maintained provided that the condition $$I_{b2} \leq I_{c1} \tag{5}$$

is satisfied. That is to say, if the condition $$\alpha_3 I_{in} \leq \beta_1 \beta_2 \alpha_3 I_{in} \quad 1 \leq \beta_1 \beta_2 \tag{6}$$

or $1 < \beta_1 \beta_2$ is established, then if the base current of the cycle of the loop circuits is $I'_{b2}$ then the base current $I''_{b2}$ of the next cycle will be greater than this, and therefore as the cycles are repeated the current flowing through the system will increase, but this will not go on infinitely. Because of the dependency of $\beta$ on the current, as the current increases a limit $\beta_{max}$ will be reached at which $\beta$ will begin to decrease, and in the steady state it appears that the abnormal current described previously will settle down where the following two conditions are satisfied simultaneously.

$$I_{b2}(n-1) = I_{b2}(n), \ \beta_1(n) \cdot \beta_2(n) \geq 1$$

Here, $I_{b2}(n)$ is the current at which stability is maintained, and it appears that in this case there will be stability at the nth loop current.

Now, firstly, the size of the dimensions of the transistors is not the main factor regarding the readiness of occurrence of the phenomenon of the flow of the previously described abnormal current, but this will be discussed on the basis of the above equations. When the current gain is measured with the dimensions (more precisely, the drain surface area) of the transistors as a parameter, there is a correlation between the current value at which the normal current converges and the dimensions of the transistors; when the transistors have larger drain surface areas, the abnormal current becomes greater, and conversely, when the transistors are small, the value of the current become small. Moreover, in cases in which negative noise is applied to the output OUT as shown by the dotted line arrow, also, similar to the case of positive noise, $$\begin{aligned}
I_{b1} &\simeq \alpha_4 I_{in}(R_{Nsub} \gtrsim r_{be1}) \\
I_{c1} &= \beta_1 I_{b1} = \beta_1 \alpha_4 I_{in} \\
I_{b2} &= I_{c1}(R_{Pwell} >> r_{be2}) \\
I_{c2} &= \beta_2 I_{b2} = \beta_1 \beta_2 \alpha_4 I_{in}
\end{aligned} \tag{7}$$

and the condition for the maintenance of the current of the system becomes $$I_{b1} \leq I_{c2} \quad 1 \leq \beta_1 \beta_2 \tag{8}$$

Figure 4:
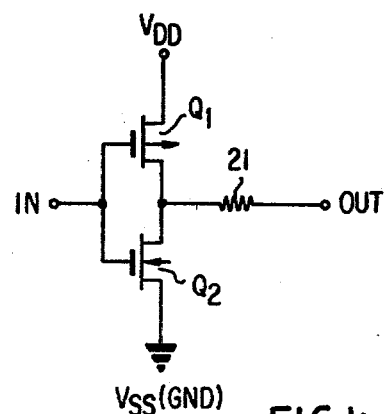
FIG. 4 and FIG. 5 show circuit diagrams of one embodiment of this invention.

FIG. 4 represents a CMOS circuit according to an embodiment of this invention which can eliminate the above-mentioned drawbacks. In this embodiment, in order to prevent a forward current from flowing from the output part into the diffused layers wherein an inverter circuit is formed by CMOS structure P channel MOS transistors and N channel MOS transistors, a protective resistance 21 is provided in the output part of the above-mentioned CMOS structure so that the noise supplied to the thyristor circuit (as shown in FIG. 3) will be absorbed in this resistance. In this embodiment, whether the polarity of the impulse noise be negative or positive, the resistance 21 performs the function of keeping the above-mentioned positive or negative noise below the voltage $V_{La}$ necessary for the commencement of conduction of the abnormal current by the parasitic thyristors, in other words, keeping it below the input current $I_{La}$ necessary for the commencement of conduction of the abnormal current, and accordingly, the abnormal current of the parasitic thyristors can be prevented.

Figure 5:
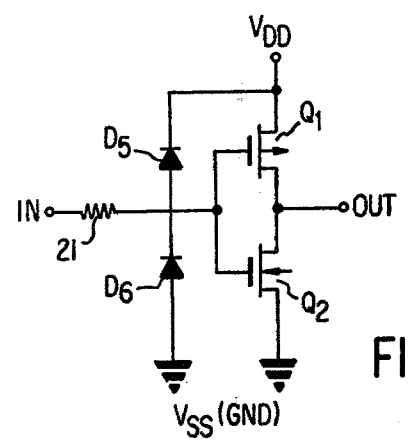
Figure 6:
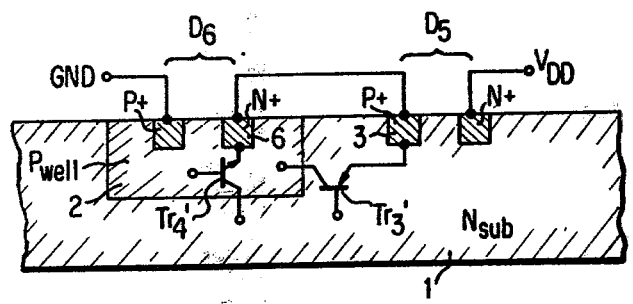
FIG. 6 shows a sectional structural diagram characteristics of the diode shown in FIG. 5.

It is also possible, as shown in FIG. 5, to insert diodes $D_5$ and $D_6$ at the input part of the CMOS circuit in order to prevent gate breakdown. This is shown in a circuit structure in FIG. 6. As shown in the drawing these diodes $D_5$ and $D_6$ form parasitic bipolar transistors $Tr'_3$ and $Tr'_4$. These transistors correspond to the parasitic bipolar transistors $Tr_3$ and $Tr_4$ of FIG. 3, and therefore become the cause of abnormal currents. Accordingly, if in the case of a structure as in FIG. 6, resistance 21 is provided at the input part IN in contrast to the case in which it is provided at the output part OUT, abnormal current due to noise from the input part can be prevented. (For example, the resistance value is several k$\Omega$).

Figure 7:
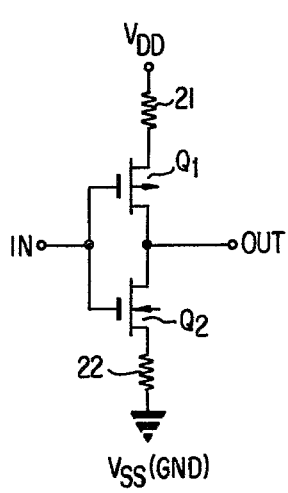
FIGS. 7-9 show circuit diagrams of further embodiments of this invention.
Figure 8:
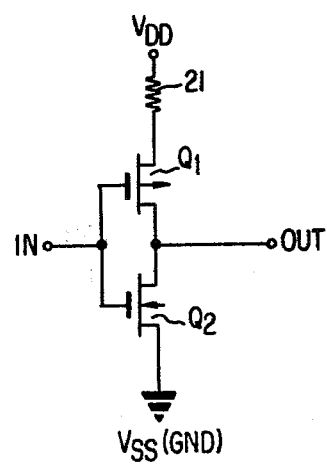
Figure 9:
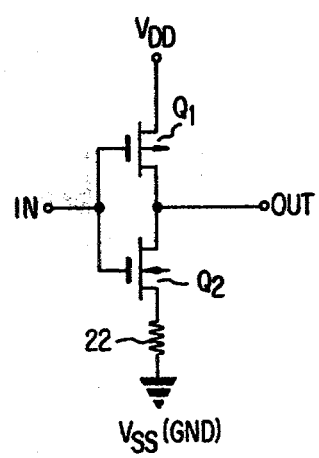

FIGS. 7–9 show other embodiments of this invention. In FIG. 7, resistance 21 (80$\Omega$–80 k$\Omega$) is disposed between the positive power source $V_{DD}$ and the drain electrode of the transistor $Q_1$; and a resistance 22 (80Ω–several kΩ) is disposed between the negative power source $V_{SS}$ and the source electrode of the transistor $Q_2$. In this circuit, when a negative noise impulse is applied to the output OUT, the resistance 22 performs the function of keeping the above-mentioned negative impulse noise below the voltage $V_{La}$. On the other hand, when a positive noise impulse is applied to the output OUT, the resistance 21 performs in the same manner. Accordingly, for either polarity of impulse noise, the abnormal current of the parasitic thyristors can be prevented.

Furthermore, a protective resistance can be disposed only on the side of the positive power source $V_{DD}$ or GND as shown in FIG. 8 and FIG. 9, in accordance with the weaker side in the actual pattern layout.

If the CMOS circuit is susceptible to positive impulse noise, the resistance is disposed to positive power source $V_{DD}$ side. On the other hand if the circuit is susceptible to negative impulse noise, the resistance is disposed to the negative power source $V_{SS}$ side.

As described above, when the present invention is used absorption resistance is provided to deal with noise causing the thyristor phenomenon in CMOS circuit systems, and it is therefore possible to provide a semiconductor integrated circuit in which an accidental large direct current does not flow between power sources. Therefore thermal breakdown can be prevented, electric power consumption can be reduced, and the circuit characteristics can be improved.

Also, this invention is not restricted to the embodiment described above; it can be applied not only to the inverter circuit shown in FIG. 1, but also to all kinds of CMOS circuits in which thyristors are formed; as regards the CMOS structure, also, the invention may be used in cases where and N-well region is formed in a P type semiconductor base plate, and also with silicon gate CMOS.

Although this invention has been disclosed and illustrated with reference to particular applications, the principles involved are susceptible of numerous other applications which will be apparent to those skilled in the art. The invention is, therefore, to be limited only as indicated by the scope of the appended claims.

What is claimed as new and desired to be secured by Letters Patent of the United States is:

1. A semiconductor integrated circuit device comprising:
    a CMOS circuit having an input part and an output part, the structure of the CMOS circuit characterized by the formation therein of parasitic thyristors;
    noise absorption means for absorbing impulse noise that otherwise could become trigger pulses for the thyristors; and
    means for connecting said noise absorption means between a source electrode of the CMOS circuit and the positive terminal of an external power source;
    said input part of the CMOS circuit being that of a semiconductor integrated circuit device.

2. A semiconductor integrated circuit device comprising:
    a CMOS circuit having an input part and an output part, the structure of the CMOS circuit characterized by the formation therein of parasitic thyristors;
    noise absorption means for absorbing impulse noise that otherwise could become trigger pulses for the thyristors; and
    means for connecting said noise absorption means between a source electrode of the CMOS circuit and the positive terminal of an external power source,
    said output part of the CMOS circuit being that of a semiconductor integrated circuit device.

3. A semiconductor integrated circuit device comprising:
    a CMOS circuit having an input part and an output part, the structure of the CMOS circuit characterized by the formation therein of parasitic thyristors;
    noise absorption means for absorbing impulse noise that otherwise could become trigger pulses for the thyristors; and
    means for connecting said noise absorption means between a source electrode of the CMOS circuit and the negative terminal of an external power source,
    said input part of the CMOS circuit being that of a semiconductor integrated circuit device.

4. A semiconductor integrated circuit device comprising:
    a CMOS circuit having an input part and an output part, the structure of the CMOS circuit characterized by the formation therein of parasitic thyristors;
    noise absorption means for absorbing impulse noise that otherwise could become trigger pulses for the thyristors; and
    means for connecting said noise absorption means between a source electrode of the CMOS circuit and the negative terminal of an external power source,
    said output part of the CMOS circuit being that of a semiconductor integrated circuit device.

* * * * *